(12) United States Patent
Yano

(10) Patent No.: US 9,514,826 B2
(45) Date of Patent: Dec. 6, 2016

(54) PROGRAMMING METHOD FOR NAND-TYPE FLASH MEMORY

(71) Applicant: Winbond Electronics Corp., Taichung (TW)

(72) Inventor: Masaru Yano, Zhubei (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 14/926,420

(22) Filed: Oct. 29, 2015

(65) Prior Publication Data
US 2016/0125947 A1 May 5, 2016

(30) Foreign Application Priority Data

Oct. 30, 2014 (JP) ................................. 2014-220916

(51) Int. Cl.
*G11C 16/10* (2006.01)
*G11C 16/16* (2006.01)
*G11C 16/32* (2006.01)

(52) U.S. Cl.
CPC ............... *G11C 16/16* (2013.01); *G11C 16/10* (2013.01); *G11C 16/32* (2013.01)

(58) Field of Classification Search
CPC ... G11C 16/16; G11C 16/102; G11C 2216/14; G11C 16/10
USPC .................................................... 365/185.12
See application file for complete search history.

(56) References Cited

U.S. PATENT DOCUMENTS 5,488,711 A * 1/1996 Hewitt ................ G06F 12/0802
365/238.5
6,778,436 B2 * 8/2004 Piau ...................... G06F 3/0607
365/185.03
7,589,999 B2 * 9/2009 Jeong ................... G11C 16/102
365/185.08
8,559,236 B2 * 10/2013 Nakai .................... G11C 16/14
365/185.11
8,583,856 B2 * 11/2013 Yao ..................... G06F 12/0246
365/185.33

(Continued)

FOREIGN PATENT DOCUMENTS

CN          103309619 A         9/2013
CN          103902234           7/2014

(Continued)

OTHER PUBLICATIONS

Korean Search Report dated Nov. 11, 2015, as issued in corresponding Korea Patent Application No. 10-2015-0052633 with English translation (5 pages).

(Continued)

*Primary Examiner* — Richard Elms
*Assistant Examiner* — Xiaochun L Chen
(74) *Attorney, Agent, or Firm* — Muncy, Geissler, Olds & Lowe, P.C.

(57) ABSTRACT

The invention provides a programming method for a NAND-type flash memory capable of reducing the drop in reliability due to data-rewriting. The programming method includes: when a block program mode is executed to perform programming for a plurality of pages in a block, while the data to be programmed is being loaded into a cache memory; and erasing the selected block; and programming the data to be programmed which is loaded into the cache memory to the erased block.

9 Claims, 9 Drawing Sheets

(56) References Cited

U.S. PATENT DOCUMENTS

| | | | |
|---|---|---|---|
| 2003/0067814 A1* | 4/2003 | Piau | G06F 3/0607 365/189.05 |
| 2005/0201177 A1* | 9/2005 | Shiraishi | G11C 16/105 365/222 |
| 2008/0049513 A1* | 2/2008 | Jeong | G11C 16/102 365/185.22 |
| 2010/0080069 A1 | 4/2010 | Imamoto et al. | |
| 2011/0213913 A1* | 9/2011 | Yao | G06F 12/0246 711/103 |
| 2012/0030441 A1 | 2/2012 | Yamashita | |
| 2012/0044764 A1* | 2/2012 | Nakai | G11C 16/14 365/185.11 |

FOREIGN PATENT DOCUMENTS

| | | |
|---|---|---|
| JP | H 07114500 | 5/1995 |
| JP | 2004-127185 A | 4/2004 |
| JP | 2006031916 | 2/2006 |
| JP | 2012018751 | 1/2012 |
| JP | 2014049149 | 3/2014 |
| KR | 10-2005-0086588 A | 8/2005 |
| KR | 10-0621637 B1 | 9/2006 |
| KR | 10-737919 B1 | 7/2007 |
| KR | 10-2009-0046568 A | 5/2009 |
| WO | WO 2014/079550 | 5/2014 |

OTHER PUBLICATIONS

Korean Office Action dated Jul. 11, 2016, as issued in corresponding Korea Patent Application No. 10-2015-0052633 (7 pages with English translation).

\* cited by examiner

|  | Erasing | Write-in | Readout |
|---|---|---|---|
| Selected W/L | 0 | 15~20V | 0 |
| Non-selected W/L | F | 10V | 4.5 |
| SGD | F | Vcc | 4.5 |
| SGS | F | 0 | 4.5 |
| SL | F | Vcc | 0 |
| P-well | 20 | 0 | 0 |

FIG. 4

Erase block management table

| Block ID | flag |
|---|---|
| Block 0 | "0" |
| Block 1 | "0" |
| Block 2 | "0" |
| Block 3 | "1" |
| Block 4 | "0" |
| Block 5 | "1" |
| ⋮ | ⋮ |
| Block m | "0" |

FIG. 7

PROGRAMMING METHOD FOR NAND-TYPE FLASH MEMORY

CROSS REFERENCE TO RELATED APPLICATIONS

This Application claims priority of Japanese Patent Application No. 2014-220916, filed on Oct. 30, 2014, the entirety of which is incorporated by reference herein.

BACKGROUND OF THE INVENTION

Field of the Invention

The present invention relates to a programming method for a NAND flash memory, and in particular to a flash memory with less degradation in reliability even though the flash memory repeatedly performs writing and erasing operations.

Description of the Related Art

An equivalent circuit of a cell array of a NAND-type flash memory is shown in FIG. 1. In a P-well, a plurality of transistors constituting NAND string(s) are formed. A NAND string includes a plurality of memory cells connected in series, a source line selection transistor connected to an end of the memory cells, and a bit line selection transistor connected to the other end of the memory cells. In the P-well, a plurality of the NAND strings are formed in the column direction. The NAND strings in one P-well constitute a block.

A source line SL is coupled to a diffusion region (a source region) of the source line selection transistor, and a bit line BL is coupled to a diffusion region (a drain region) of the bit line selection transistor. A plurality of word lines WL1, WL2, . . . , WLn are formed in the row direction which crosses with the NAND string. Each word line WL is connected to the control gates of the memory cells in the corresponding row. A selection gate line SGS is connected to the selection gates of the source line selection transistors in the corresponding row. A selection gate line DSG is connected to the selection gates of the bit line selection transistors in the corresponding row. When the source line selection transistor is conducted by the selection gate line SGS, the NAND string is coupled to the source line SL. When the bit line selection transistor is conducted by the selection gate line DSG, the NAND string is coupled to the bit line BL.

The NAND-type flash memory erases data in blocks. In the erase operation, 0V or voltage lower than the P-well is applied to the word lines of the selected block, and an erase pulse of positive voltage is applied to the P-well. In the programming (write-in) operation, 0V is applied to the P-well and high voltage is applied to the selected word line. 0V or positive potential is applied to the bit line BL, but in the case of 0V, the silicon surface of the selected cell becomes 0V, tunnel currents of electrons flow from the silicon substrate to the floating gate, and the threshold value of the memory cell becomes higher than a specified value (please refer to Japan Patent Publication No. 2014-049149).

In the conventional NAND-type flash memory, if the write-in operation and erase operation are performed repeatedly, degradation of the film quality of the oxide film under the floating gate occurs, and defection, such as the write-in defection or data variation following a period of time after the data is written, is generated. In such cases, there are issues where the number of rewriting data is limited, and the reliability cannot be assured if the number exceeds the threshold value. There are several reasons that the oxide film degrades, and one is that the oxide film degrades during the transition from the application of the erase pulse to the P-well to the write-in operation. After the erase pulse is applied to the P-well, the interval until the writing pulse applied to the word line is varied to perform the data rewriting, and the I-V characteristics of the cell are measured. The results of this measurement are shown in FIG. 2. Specifically, the initial I-V characteristic and the I-V characteristics which are measured after rewriting the data up to ten thousand times with three kinds of intervals: 0.05 second (solid line), 0.5 (dash line), and 5 second (dot line) are shown. From the diagram, it can be understood that the I-V characteristic changes more relative to the initial I-V characteristic as the interval becomes longer. Namely, if the interval between the erase operation and the write-in operation becomes longer, the trap level of the silicon interface increases, and thus the dependency between the I-V characteristic and the potential of the control gate decreases. Therefore, it is considered that the period from the application of the erase pulse to the write-in operation causes the oxide film to degrade. This degradation of the oxide film will reduce the reliability of the micronized memory cell and decrease the maximum number of data-rewrites of which the reliability can be assured.

The purpose of the invention is to provide a programming method for a NAND-type flash memory that solves the above problems and reduces the degradation of the reliability caused by rewriting data.

BRIEF SUMMARY OF THE INVENTION

A detailed description is given in the following embodiments with reference to the accompanying drawings.

The invention provides a programming method for a NAND-type flash memory including: when a block programming mode which executes programming to a plurality of pages in a block is determined, selecting a block from a memory array and erasing the selected block while loading data to be programmed into a memory portion; and programming the data to programmed which is loaded in the memory portion to the erased block.

It is preferred that the data to be programmed is programmed right after the selected block is erased. It is preferred that the data to be programmed is programmed sequentially from the first page of the erased block. It is preferred that the programming method further includes: setting an erase flag to show that a block is erasable to blocks, wherein a block to be erased is selected from the memory array according to the erase flag. It is preferred that the operation that selects a block is selecting the block from the memory array that has the longest period from erase operation to programming operation. It is preferred that the memory portion is a cache memory inside or outside the NAND-type flash memory. For example, when the memory portion is built into the NAND-type flash memory, the selection and erasing of the block are performed while the data to be programmed is being loaded into the cache memory. When the memory portion is a cache memory connected to the exterior of the NAND-type flash memory, the selection and erasing of the block are performed while the data to be programmed is being loaded the cache memory.

The invention also provides a NAND-type flash memory including: a memory array comprising NAND-type strings; a selection means selecting a block of the memory array; a determination means determining a block programming mode which executes programming to a plurality of pages in a block; an erase means, in cases where the block programming mode is determined, erasing the block selected by the selected means while the data to be programmed is loaded to a cache memory; and a programming means programming the data to be programmed which is loaded into the cache memory to the block erased by the erase means.

According to the invention, by programming a block right after the block is erased, the period from the erase operation to the programming operation is shortened. Therefore, degradation of the oxide film is alleviated, thus increasing the maximum number of data-rewrites of which reliability can be assured. Furthermore, by erasing the selected block while the data to be programmed is being loaded in the memory portion, the necessary time for the programming can be shortened and a high-speed programming operation can be achieved.

BRIEF DESCRIPTION OF THE DRAWINGS

The present invention can be more fully understood by reading the subsequent detailed description and examples with references made to the accompanying drawings, wherein:

FIG. 4 is a diagram showing an example of voltage applied to each portion of the flash memory in operation;

FIG. 7 is a diagram showing an example of an erase block management table in accordance with Embodiment 1 of the invention;

DETAILED DESCRIPTION OF THE INVENTION

The embodiments will be described in detail in reference to the drawings. Note that the drawings emphasize each element for ease of understanding, so the drawings are different from the real devices in scale.

Figure 3:
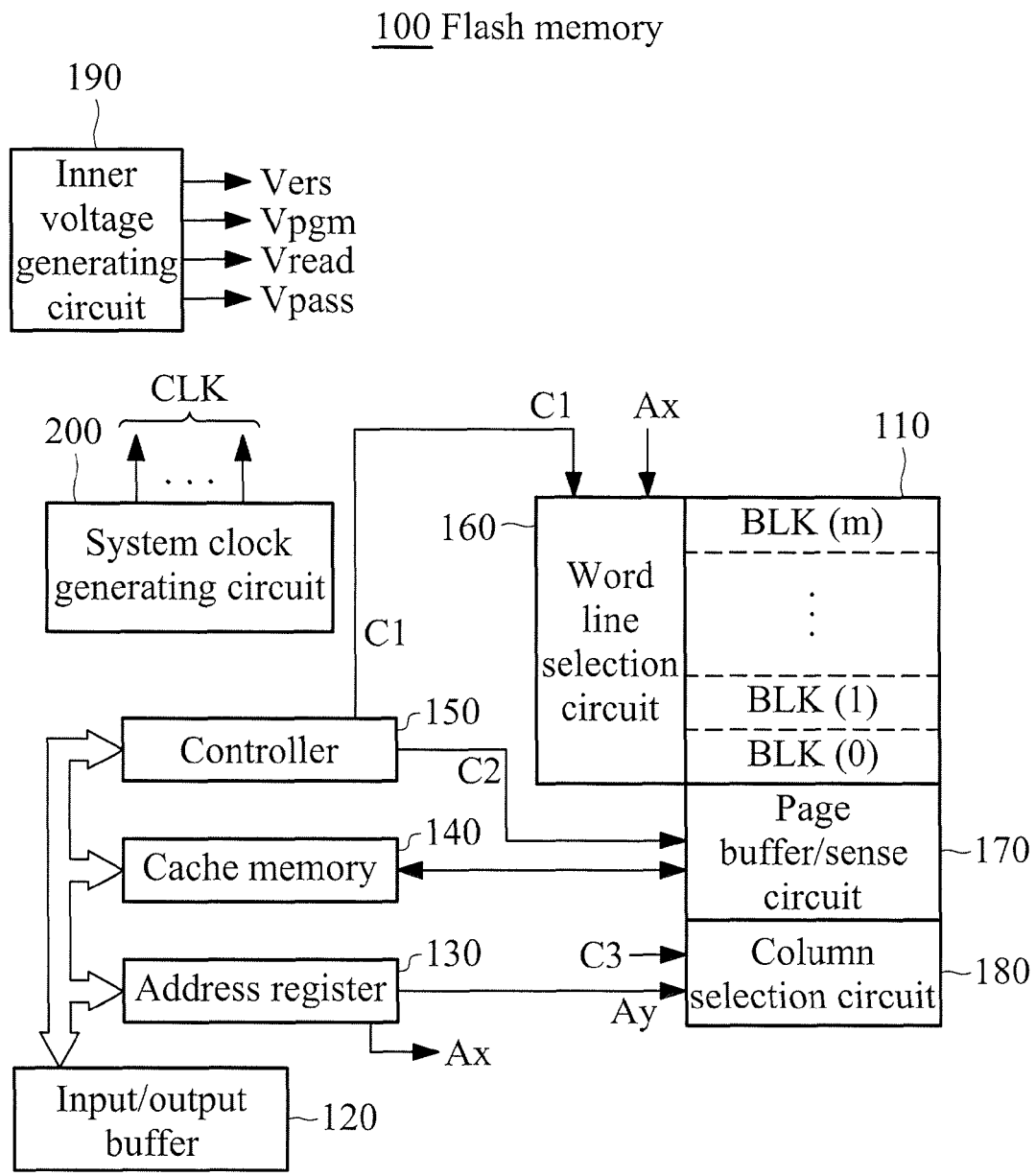
FIG. 3 is a block diagram showing an example of the entire configuration of a NAND-type flash memory in accordance with an embodiment of the invention.

FIG. 3 is a block diagram showing an example of the entire configuration of a NAND-type flash memory in accordance with an embodiment of the invention. As shown in FIG. 3, the flash memory 100 of the embodiment comprises: a memory array 110, formed from a plurality of memory cells arranged in rows and columns; an input/output buffer 120, connected to an external input/output terminal I/O; an address register 130, receiving address data from the input/output buffer 120; a cache memory 140, holding the input and output data; a controller 150, generating control signals C1, C2, C3, etc. to control each part according to command data and external control signals (such as chip enable or address latch enable, which are not shown in Figs) from the input/output buffer 120; a word line selection circuit 160, decoding row address information Ax from the address register 130 and selecting a block and a word line according to the decode result; a page buffer/sense circuit 170, holding the date read out via the word line and holding the data to be programmed via the bit line; a column selection circuit 180, decoding column address information Ay from the address register 130 and selecting a bit line according to the decode result; an internal voltage generating circuit 190, generating the necessary voltages used for reading out, programming (writing), erasing data, etc. (such as a programming voltage Vpgm, a pass voltage Vpass, a readout voltage Vread, an erase voltage Vers, etc.); and a system clock generating circuit 200, generating an internal system clock signal CLK.

Figure 1:
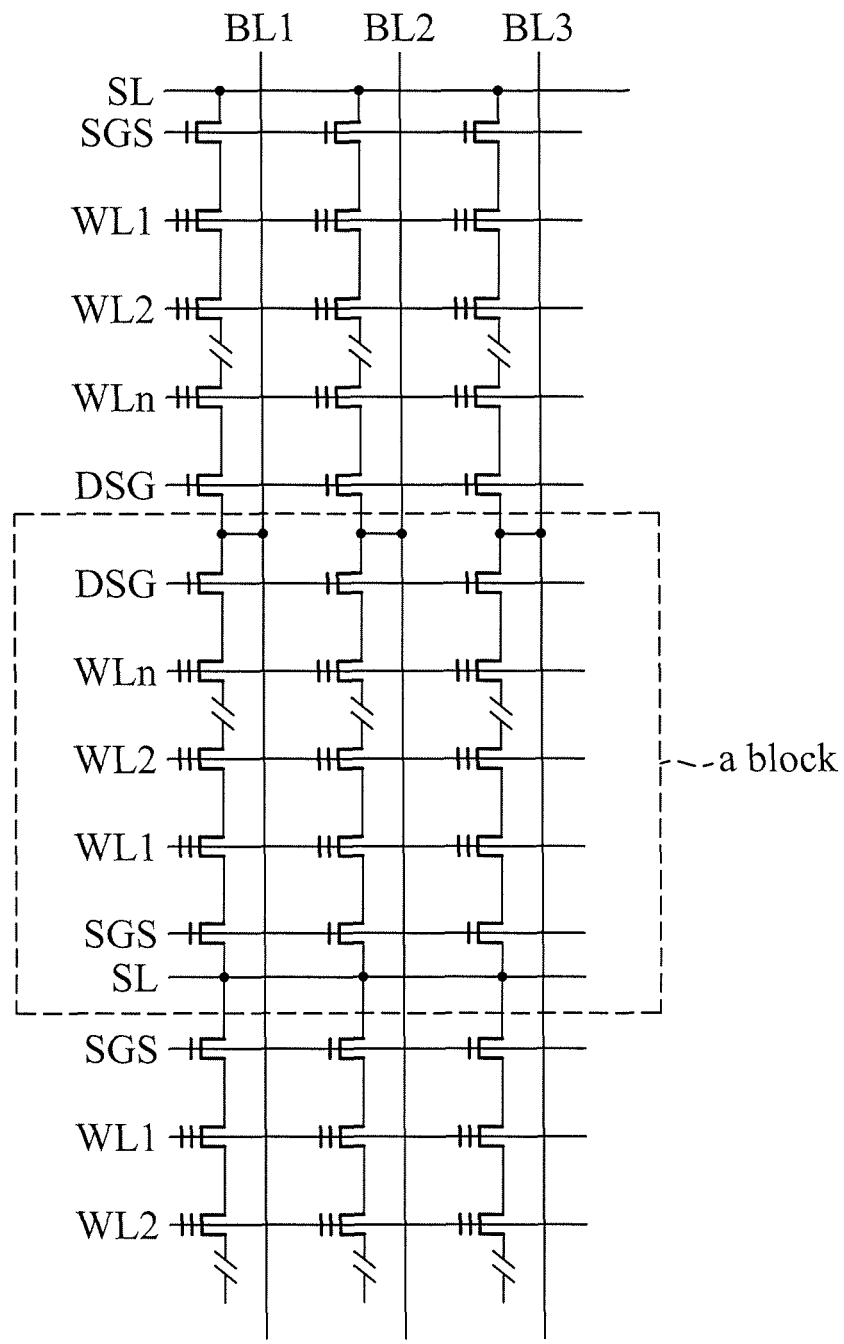
FIG. 1 is an equivalent circuit diagram of a portion of a cell array of a NAND-type flash memory.
Figure 2:
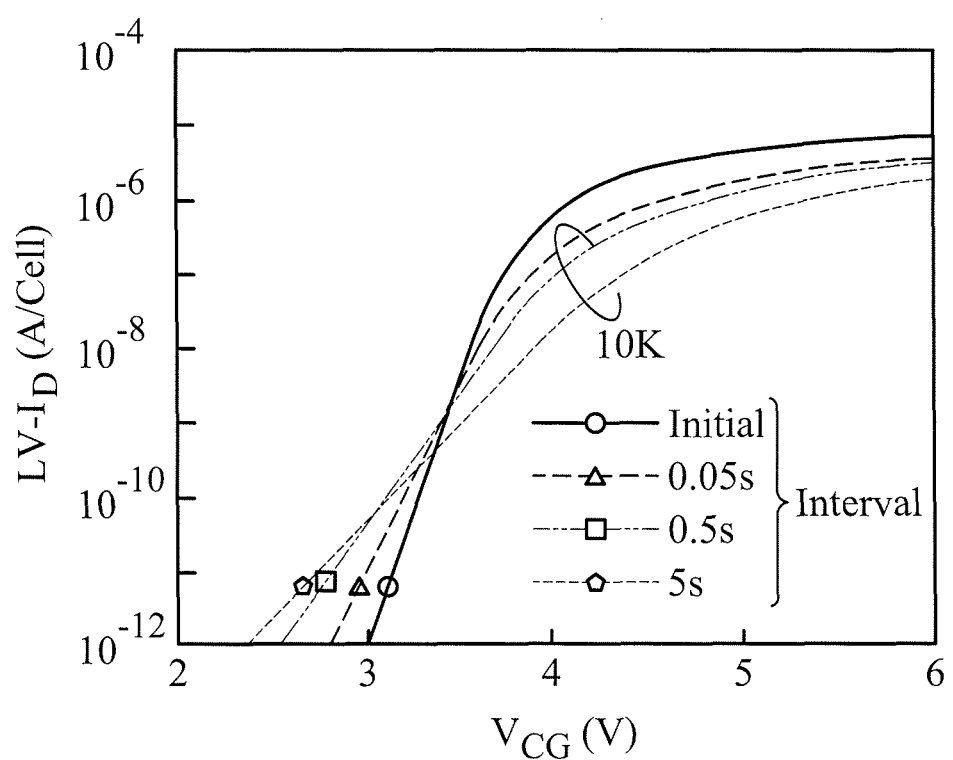
FIG. 2 is a diagram showing the dependency between the I-V characteristic of the memory cell and the interval from an erase operation to a write-in operation.

As shown in FIG. 1, the memory array 110 is formed from NAND strings including a plurality of memory cells connected in series. The memory cell has a MOS structure comprising a source/drain which is a n+ diffusion region formed in a P-well, a tunnel oxide film formed on the channel between the source and the drain, a floating gate (charge accumulation layer) formed on the tunnel oxide film, and a control gate formed on the floating gate via a dielectric film. Typically, when positive charges are accumulated on the floating gate (namely, when data "1" is written in), the threshold value is negative and the memory cell is switched on because the control gate is supplied with 0V. When negative charges are accumulated on the floating gate (namely, when data "0" is written in), the threshold value is shifted to positive and the memory cell is switched off because the control gate is supplied with 0V. However, the memory cell is not limited to storing a single bit. The memory cell may store multi-bits.

FIG. 4 is a table showing an example of bias voltages applied during each operation of the flash memory. In a readout operation, a positive voltage is applied to the bit line, a voltage (for example, 0V) is applied to the selected word line, a pass voltage Vpass (for example, 4.5V) is applied to the non-selected word line, a positive voltage (for example, 4.5V) is applied to the selection gate lines SGD and SGS to turn on the bit line selection transistor TD and the source line selection transistor TS, and the common source line is supplied with 0V. In a programming (write-in) operation, a high voltage which is a programming voltage Vpgm (for example, 15~20V) is applied to the selected word line, a pass voltage of middle potential (for example, 10V) is applied to the non-selected word line, the bit line selection transistor TD is switched on, the source line selection transistor TS is switched off, and the bit line GBL is supplied with potential corresponding to data "0" or data "1". In an erase operation, 0V is applied to the word lines (namely, the control gates) selected in a block and a high voltage (for example, 20V) is applied to the P well to pull the electrons off the floating gate to the substrate. Thereby, data is erased in block units.

Next, a programming method in accordance with Embodiment 1 of the invention is illustrated. In a preferred aspect of the embodiment, in order to improve the rewriting ability (endurance ability) of the memory cell, the period from the erase operation to the programming (write-in) operation on the same block is shortened as much as possible. In a more preferred aspect of the embodiment, the period from the programming (write-in) operation to the erase operation on the same block is extended as much as possible, which helps the recovery of the tunnel oxide film of the memory cell and improves the rewriting ability.

Figure 5:
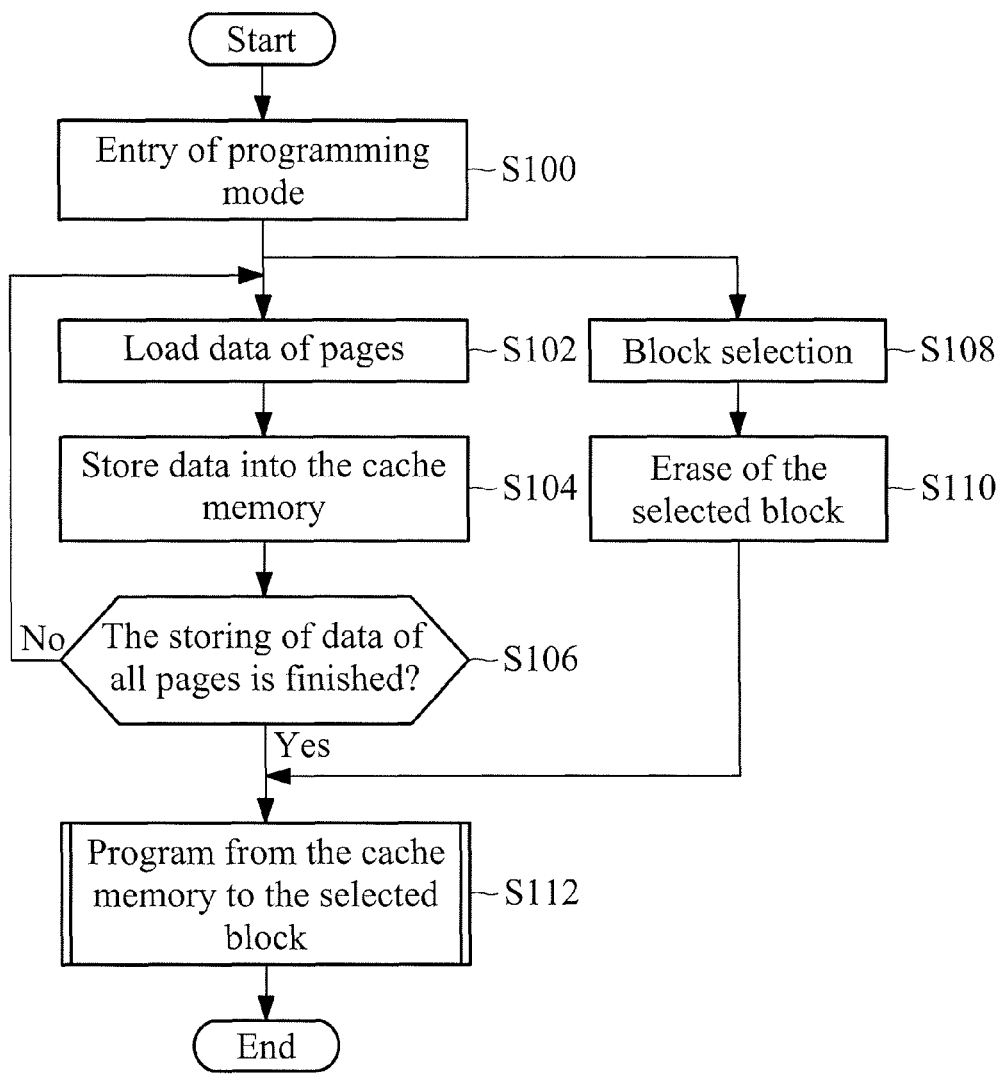
FIG. 5 is a flowchart for illustrating a programming method in accordance with Embodiment 1 of the invention.

FIG. 5 is a flowchart for illustrating a programming method of Embodiment 1. First, the controller 150 determines whether the flash memory has to enter to a block programming mode according to a command received from an external host device via the input/output buffer 120. "Block programming" in the embodiment means a mode to page program data into a plurality of pages in a block successively. For example, if a block is formed from 64 pages, the programming operation can be performed successively to at most 64 pages in the block programming mode.

If the controller 150 determines that an entry to the block programming mode (S100), loading of the data to be programmed is started (S102) and the loaded data is stored into the cache memory 140 (S104).

Figure 6:
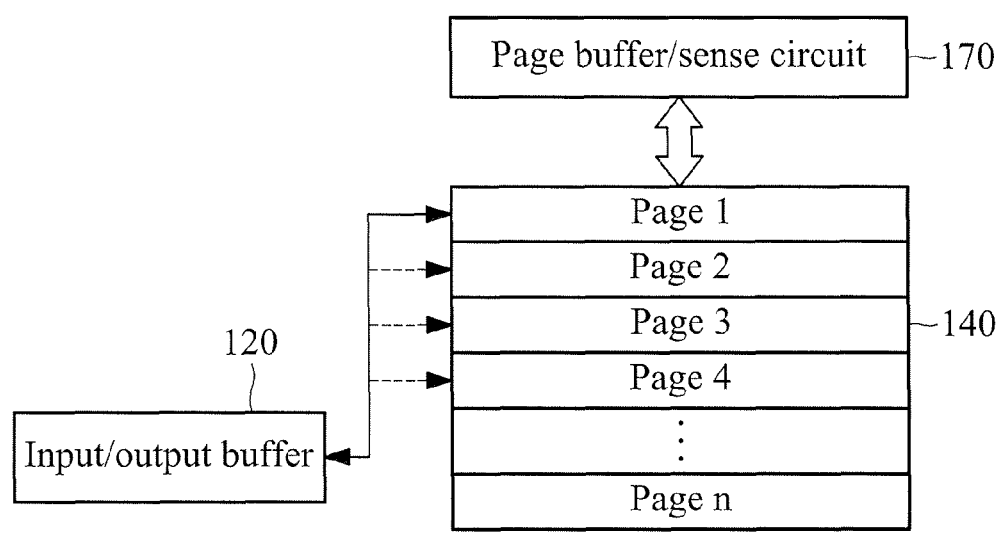
FIG. 6 is a diagram for illustrating data loading to a cache memory.

Assuming that the number of pages of a block is n, n pages of data is stored into the cache memory 140. The cache memory 140 is not especially limited, but it can be formed from, for example, a SRAM capable of rapid operations. In a preferred aspect, the operations writing data into the cache memory 140 and reading out the data are controlled by the controller 150. FIG. 6 is a diagram for illustrating the data loading to the cache memory 140. First, the data to be programmed corresponding to page 1 (the beginning of the block) is taken from the input/output buffer 120, and stored into the cache buffer 140. Once the storing operation for the data to be programmed corresponding to page 1 is finished, the data to be programmed corresponding to page 2 is taken from the input/output buffer 120 and is stored into the cache buffer 140. In this way, the data to be programmed corresponding to page 1 to page n is stored one by one into the cache buffer 140 in page units. If the configuration of cache memory 140 can store a plurality of pages, the cache memory 140 can be formed with a pipe line structure so as to make the data readout/write operate in high speed. As described later, it is also appropriate that the cache memory 140 doesn't have the capacity to store n pages of data at the same time.

During the period wherein the data to be programmed is being loaded into the cache memory 140, the controller 150 selects a block to be erased (S108). In a preferred aspect, the controller 150 selects an erasable block in the memory array 110. The erasable block is, for example, a block to which the external host device indicates that the erase operation is to be performed, or an erasable block that is generated when wear leveling technology is performed to prevent the rewriting from being concentrating on a specific block (Namely, when the page of a block in use is copied to a block with less instances of having been rewritten, the block in use becomes erasable).

The controller 150 can comprise an erase block management table to manage those kinds of erasable blocks. An example of the erase block management table is shown in FIG. 7. In the erase block management table, a flag showing whether a block is erasable or not is set to each block. In the example shown in FIG. 7, erase flags "1" are set to block 3 and block 5 capable of being erased. The controller 150 refers to the erase block management table, and searches erasable blocks, for example, from block 0 to block m or reversely, so as to select the first block set with erase flag "1". Next, in selecting a block, it is also appropriate to search blocks in the same order from the position where the previous block is selected, or it is also appropriate to search blocks from block 0 or block m.

The selection of blocks can be performed by other algorithms. For example, when wear leveling technology is employed, it is also appropriate to count the times of erasing a block in advance, and then select a block with the minimum count value from the erasable blocks. Further, in another algorithm, it is also appropriate to select an erasable block which has a long period from the programming operation to the erase operation. The block having a long period from the programming operation to the erase operation has a tendency showing that the recovery of the oxide film of the memory cells is better. In this case, the erase flags (for example, multi-bits) showing the ranking of the period from the programming operation to the erase operation is set to the blocks.

When selecting a block to be erased, the controller 150 then erases the selected block (S110). Specifically, as shown in FIG. 4, for example 0V is applied to the selected word line of the selected block, for example 20V is applied to the P-well, and the non-selected word lines, the selection gate lines SGD and SGS, and the source line are floating.

When the storage of all the pages of data into the cache memory 140 is finished (S106) and the erasing of the selected blocks is finished (S110), the controller 150 performs the operation of programming from the cache memory to the selected blocks.

Figure 8:
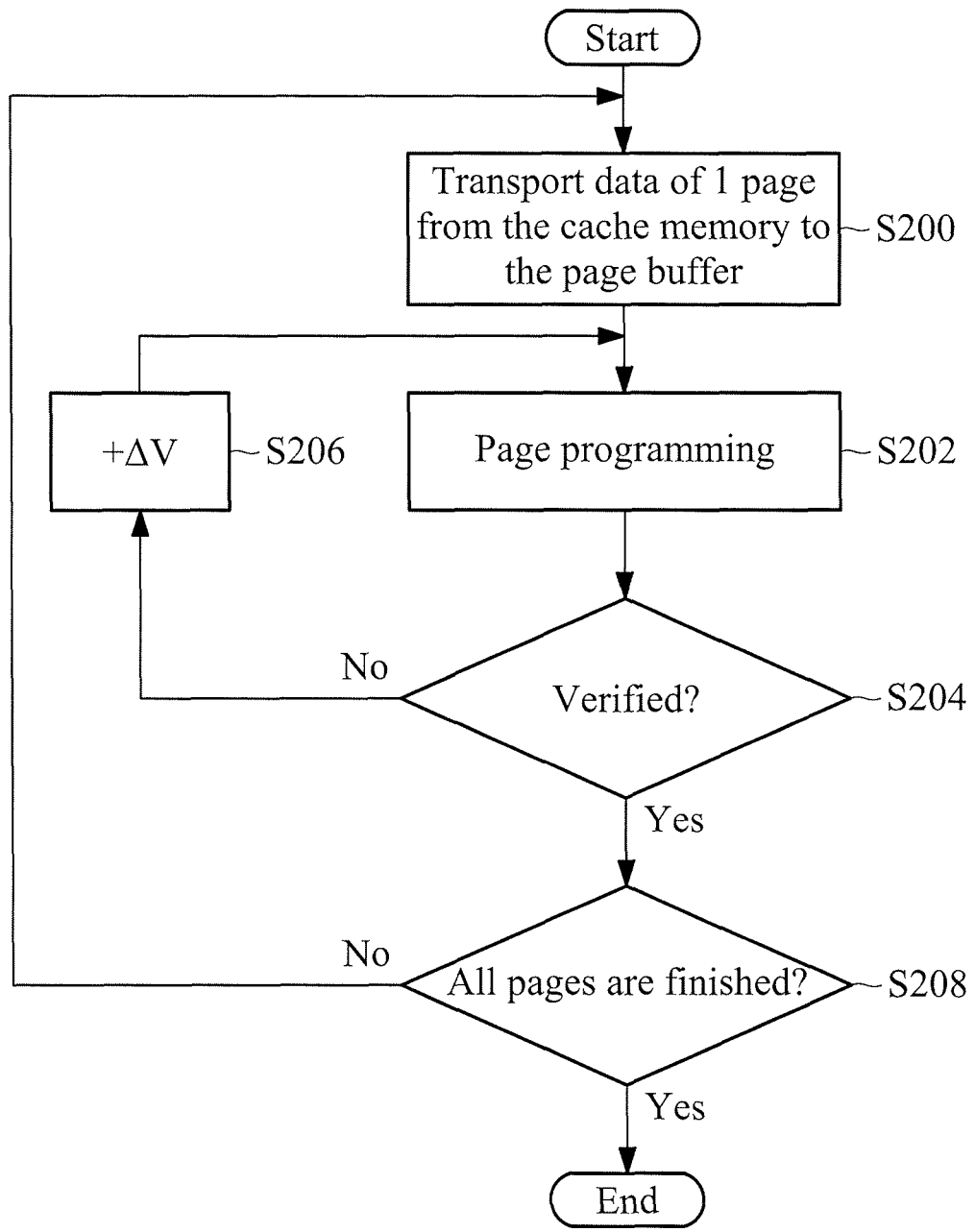
FIG. 8 is a flowchart for illustrating the cache programming operation shown in FIG. 5.

FIG. 8 is a flowchart for illustrating the cache programming operation of step S112. First, as shown in FIG. 6, the controller 150 reads out the data stored in page 1 of the cache memory 140, and transports those data to the page buffer/sense circuit 170 (S200). Next, the word line selection circuit 160 applies a bias voltage as shown in FIG. 4, that is to say, the word line selection circuit 160 applies a programming pulse to a selected word line corresponding to page 1 of the selected block and applies a middle voltage to the other non-selected word lines to perform a programming operation to page 1 (S202). Then a readout verification of page 1 is performed (S204). If the result is not qualified, the programming pulse is raised by $+\Delta V$ and the programming operation is performed again (S206). If the result is qualified, the programming operation is then performed on page 2. Namely, the word line selection circuit 160 applies a programming pulse to a selected word line corresponding to page 2. In this way, the data from page 1 to page m is successively programmed into the selected block (S208). In an aspect, when performing the block programming mode, the controller 150 counts the times of the page programming. If the count value is equal to the number of pages of the block, the controller 150 determines that the programming of the data of the previous page is finished and then ends the block programming operation.

According to the embodiment, in the block programming operation, a block to be programmed is selected and erased, and then the block is programmed. Therefore, the period from the erase operation to the programming operation can be set very short. For example, if a block has 64 pages, the period from the erase operation to the programming operation can be equal to or shorter than 50 msec. Therefore, the endurance ability of the memory cells can be improved. Further, the selection and the erasing of a block are performed while the data to be programmed is being loaded into the cache memory. Thereby, high-speed block programming operation can be achieved.

Next, Embodiment 2 of the invention is described. Embodiment 1 shows an example where the NAND flash memory has a built-in cache memory 140 and the cache memory 140 can store data from all pages of a block. Embodiment 2 utilizes a cache memory connected to the external part of the flash memory 100.

Figure 9:
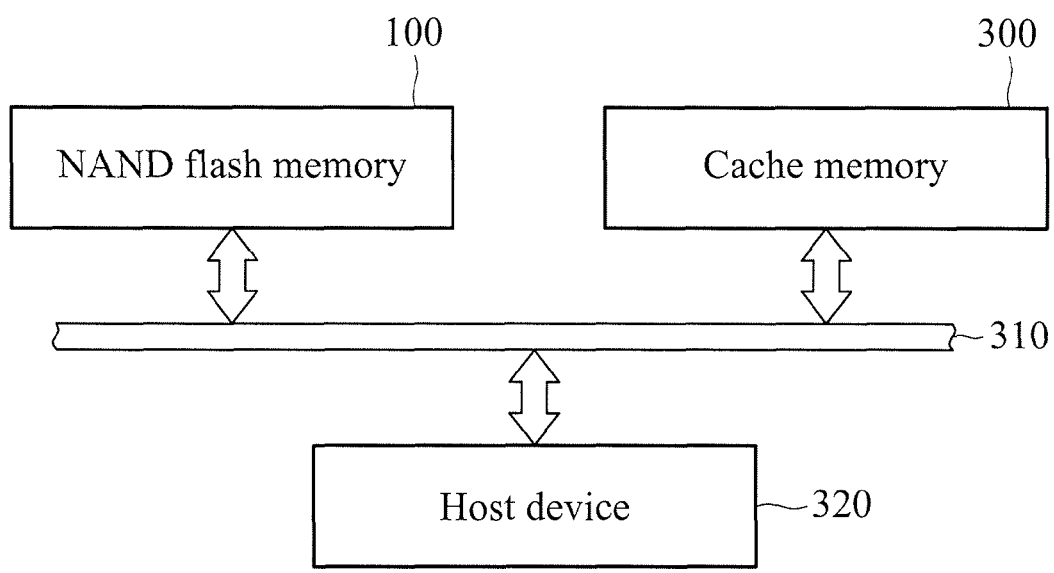
FIG. 9 is a diagram showing an example of the configuration of a memory device in accordance with Embodiment 2 of the invention.

FIG. 9 is a diagram showing an example of a memory device in accordance with Embodiment 2 of the invention. As shown in FIG. 9, the memory device has a flash memory 100, a cache memory 300, and a host device 320 connected to the flash memory 100 and the cache memory 300 via a bus 310. The cache memory 140 built into the flash memory 100 has the capacity to store one or several pages of data. The cache memory 140, as with Embodiment 1, can transmit/receive data to/from the page buffer/sense circuit 170. On the other hand, the cache memory 300 connected to the exterior of the flash memory 100 can have the capacity to store n pages of data of a block, and can transmit/receive data to/from the flash memory 100. The host device 320 controls the flash memory 100 and controls the readout and write-in of the data of the cache memory 300.

First, when the block programming operation is performed to the flash memory 100, the host device 320 transmits a block programming command or control signal to the flash memory 100. The controller 150 of the flash memory 100 decodes the receiving command, and thereby determines the transition to the block programming mode starts. The host device 320 indicates the block programming to the flash memory 100 and in the meantime loads the data to be programmed into the cache memory 300. During the period where the data to be programmed is loaded to the cache memory 300 from the host device 320, the controller 150, like in Embodiment 1, selects a block to be programmed (S108 of FIG. 5) and erases the selected block (S110). At the time the erase operation of the selected block is finished, the loading to the cache memory 300 has been finished.

Next, when the erase operation of the selected block is finished, the controller 150 performs cache programming. In an aspect, when the erase operation of the selected block is finished, for example the controller 150 outputs a control signal showing the state of the flash memory, such as a Ready signal, to the host device 320 to inform the host device 320 that the flash memory is under a cache programmable state. The host device 320 transmits a command (which is irrelevant with the control signal such as the Ready signal) including the message "the block programming is performed right after the loading to the cache memory is finished" to the cache memory 300.

When the cache programming is started, the host device 320 performs the readout of data from the cache memory 300. Specifically, first, the host device 320 reads the data corresponding to page 1 from the cache memory 300. The flash memory 100 obtains the data of page 1 via the input/output buffer 120 and the data of page 1 is loaded into the cache memory 140. Next, the data loaded into the cache memory 140 is transmitted to the page buffer/sense circuit 170, and then the programming of page 1 is executed, which is the same as in Embodiment 1. In the meantime, the data corresponding to page 2 is read from the cache memory 300. The data of page 2 is loaded into the cache memory 140 via the input/output buffer 120. After the programming of page 1 is finished, the programming of page 2 is executed. In this way, the data from page 1 to page m is successively programmed to the selected block.

According to Embodiment 2, the erasing of the selected block is performed during the period where the data to be programmed is loaded into the cache memory 300 connected to the exterior of the flash memory 100. The data loaded into the cache memory 300 can immediately be programmed to the erased block. Thereby, degradation due to data rewriting of the memory cell can be reduced.

Embodiment 2 shows an example of the cache memory 300 being connected to the exterior of the flash memory 100 and the flash memory 100 having a built-in cache memory 140. However, in order to raise the speed of the block programming (namely, in order to shorten the loading time of data from the cache memory 300 to the page buffer/sense circuit 170), it is also appropriate that the data is moved from the cache memory 300 into the cache memory 140 or the page buffer/sense circuit 170 before the cache programming is started. Furthermore, in cases where the cache memory 300 is connected to the exterior of the cache memory 100, the cache memory 140 of the flash memory is not indispensable. In this case, the data read from the cache memory 300 is loaded into the page buffer/sense circuit 170 via the input/output buffer 120.

The above embodiment shows that the memory cell stores 1 bit of data. However, it is also appropriate that the memory cell may store multiple bits of data. Furthermore, the above embodiment shows that the NAND strings are formed on the surface of the substrate. However, it is also appropriate that the NAND strings may be formed on the surface of the substrate spatially.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A programming method for a NAND-type flash memory, comprising:
   when a block programming mode which executes programming to a plurality of pages in a block is determined, selecting a block from a memory array and erasing the selected block while loading data to be programmed into a cache memory; and
   programming the data to be programmed which is loaded in the cache memory to the erased block via a page buffer,
   wherein the data to be programmed is programmed right after all the plurality of pages of the data to be programmed are loaded into the cache memory, and
   wherein the operation of selecting a block is to select a block from the memory array that has a longest period from a previous erase operation to a previous programming operation following the previous erase operation.

2. The programming method as claimed in claim 1, wherein the data to be programmed is programmed right after the selected block is erased.

3. The programming method as claimed in claim 1, wherein the data to be programmed is programmed sequentially from a first page of the erased block.

4. The programming method as claimed in claim 1, further comprising:
   setting an erase flag to show that a block is erasable to blocks, wherein a block to be erased is selected from the memory array according to the erase flag.

5. The programming method as claimed in claim 1, wherein the cache memory is built in the NAND-type flash memory.

6. The programming method as claimed in claim 1, wherein the cache memory is connected to the exterior of the NAND-type flash memory.

7. A NAND-type flash memory comprising:
   a memory array comprising NAND-type strings;
   a selection means selecting a block of the memory array;
   a determination means determining a block programming mode which executes programming to a plurality of pages in a block;

an erase means, in cases where the block programming mode is determined, erasing the block selected by the selected means while the data to be programmed is loaded to a cache memory; and a programming means programming the data to be programmed which is loaded into the cache memory to the block erased by the erase means via a page buffer, wherein the data to be programmed is programmed right after all the plurality of pages of the data to be programmed are loaded into the cache memory, and wherein the operation of selecting a block is to select a block from the memory array that has a longest period from a previous erase operation to a previous programming operation following the previous erase operation.

8. The NAND-type flash memory as claimed in claim 7, wherein the selection means selects a block from the memory array: the block attached with an erase flag to show that a block is erasable.

9. The NAND-type flash memory as claimed in claim 7, wherein the programming means programs the data loaded into the cache memory sequentially from a first page of the selected block.

* * * * *